(12) United States Patent
Jones

(10) Patent No.: US 8,869,013 B1
(45) Date of Patent: Oct. 21, 2014

(54) CIRCUIT ENABLING AND A METHOD OF GENERATING A PRODUCT IN A DECODER CIRCUIT

(75) Inventor: Ben J. Jones, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 145 days.

(21) Appl. No.: 13/308,748

(22) Filed: Dec. 1, 2011

(51) Int. Cl.
*H03M 13/00* (2006.01)
*H03M 13/15* (2006.01)
*G06F 7/72* (2006.01)

(52) U.S. Cl.
CPC ............. *H03M 13/158* (2013.01); *G06F 7/724* (2013.01)
USPC ........................................................ 714/781

(58) Field of Classification Search
CPC ............................. H03M 13/158; G06F 7/724
USPC .................................................. 714/752–773
See application file for complete search history.

(56) References Cited

U.S. PATENT DOCUMENTS

| | | | | |
|---|---|---|---|---|
| 4,847,801 | A * | 7/1989 | Tong | 708/492 |
| 5,535,225 | A * | 7/1996 | Mayhew et al. | 714/785 |
| 5,999,959 | A * | 12/1999 | Weng et al. | 708/492 |
| 6,061,826 | A * | 5/2000 | Thirumoorthy et al. | 714/784 |
| 6,131,179 | A * | 10/2000 | Okita | 714/784 |
| 6,252,464 | B1 * | 6/2001 | Richards et al. | 331/4 |
| 6,539,515 | B1 * | 3/2003 | Gong | 714/784 |
| 6,968,493 | B1 | 11/2005 | Weng | |
| 7,096,409 | B2 * | 8/2006 | Banks | 714/784 |
| 7,403,964 | B2 * | 7/2008 | Porten et al. | 708/492 |
| 7,793,200 | B1 | 9/2010 | Parekh et al. | |
| 8,280,938 | B2 * | 10/2012 | Yen | 708/492 |

OTHER PUBLICATIONS

U.S. Appl. No. 13/308,726, filed Dec. 1, 2011, Jones et al.
Francis, Michael, *Forward Error Correction on ITU-G.709 Networks using Reed-Solomon Solutions*, XAPP952 (v1.0), Dec. 5, 2007, pp. 1-14, Xilinx, Inc., San Jose, California, USA.
Gilardi, GianLuca et al. *Designing Convolutional Interleavers with Virtex Devices*, XAPP222 (v1.0), Sep. 27, 2000, pp. 1-6, Xilinx, Inc., San Jose, California, USA.

\* cited by examiner

*Primary Examiner* — Steve Nguyen
(74) *Attorney, Agent, or Firm* — John J. King

(57) ABSTRACT

A circuit enabling generating a product in a decoder circuit is disclosed. The circuit comprises a first memory element coupled to receive a first error value and a first portion of a second error value; a second memory element coupled to receive the first error value and a second portion of the second error value; and an adder circuit coupled to add an output of the first memory element and an output of the second memory element. The output of the first memory element is generated in response to an address based on the first error value and the first portion of the second error value, and the output of the second memory element is generated in response to an address based on the first error value and the second portion of the second error value. A method for generating a product in a decoder circuit is also disclosed.

20 Claims, 6 Drawing Sheets

CIRCUIT ENABLING AND A METHOD OF GENERATING A PRODUCT IN A DECODER CIRCUIT

FIELD OF THE INVENTION

An embodiment relates generally to integrated circuit devices, and in particular to a circuit enabling and method of generating a product in a decoder circuit.

BACKGROUND

The transmission of data is typically required in integrated circuits and electronic systems. However, for a variety of reasons, data may become corrupted during the transmission. While the accurate transmission of data is important in most systems, the transmission of corrupted data may significantly impact the performance of the integrated circuit. In some instances, corrupted data stored in the integrated circuit may render the integrated circuit unusable until the correct data is restored in the memory. Accordingly, steps are often taken to ensure that data is properly stored in a memory of an integrated circuit. For example, encoded data may be read back to check for errors.

Error checking may include both error detection and error correction in the case of a single error, or error detection without error correction in the case of multiple errors. For example, forward error-correction is a type of signal processing that improves data reliability by introducing a known structure into a data sequence prior to transmission or storage of the data sequence. This known structure enables a receiving system to detect and possibly correct errors caused by corruption in the data transmission channel or the receiver. Coding techniques enable the decoder to correct errors without requesting retransmission of the original information. However, techniques such as forward error correction according to some protocols may include steps which may be difficult to implement efficiently, and may result in significant limitations when implemented in an integrated circuit.

SUMMARY

A circuit enabling generating a product in a decoder circuit is disclosed. The circuit comprises a first memory element coupled to receive a first error value and a first portion of a second error value; a second memory element coupled to receive the first error value and a second portion of the second error value; and an adder circuit coupled to add an output of the first memory element and an output of the second memory element. The output of the first memory element is generated in response to an address based on the first error value and the first portion of the second error value, and the output of the second memory element is generated in response to an address based on the first error value and the second portion of the second error value.

The first error value may be an evaluated error locator derivative, and the second error value may be an evaluated error evaluator. Each of the first memory element and the second memory element may comprise a 2K×8 memory array. The circuit may further comprise a third memory element coupled to receive the first error value and a third portion of the second error value, wherein the third memory element comprises a 1K×8 memory array. Further, the second error value may comprise an 8-bit signal, wherein the 8 bits of the second error value are divided between the first, second and third portions of the second error value.

According to an alternate embodiment, a circuit enabling generating a product in a decoder circuit comprises a first memory element coupled to receive a first error value and a first portion of a second error value; a second memory element coupled to receive the first error value and a second portion of the second error value; a third memory element coupled to receive a first error value and a third portion of a second error value; a fourth memory element coupled to receive the first error value and a fourth portion of the second error value; and an adder circuit coupled to add outputs of the first, second, third and fourth memory elements. The output of the first memory element is generated in response to an address based on the first error value and the first portion of the second error value, the output of the second memory element is generated in response to an address based on the first error value and the second portion of the second error value, the output of the third memory element is generated in response to an address based on the first error value and the third portion of the second error value, and the output of the fourth memory element is generated in response to an address based on the first error value and the fourth portion of the second error value.

According to the alternate embodiment, the first error value may be an evaluated error locator derivative and the second error value is an evaluated error evaluator. Further, each of the first, second, third and fourth memory elements may comprise a 1K×8 memory array. The first and second memory elements may be portions of a first dual port random access memory, and the third and fourth memory elements may be portions of a second dual port random access memory. The circuit may comprise a Reed-Solomon decoder, wherein an output of the adder circuit comprises a Galois Field division result. Further, the first, second, third, and fourth memory elements may be implemented in an integrated circuit having programmable resources.

A method of generating a product in a decoder circuit is also disclosed. The method comprises coupling a first error value to each memory element of a plurality of memory elements; coupling, for each memory element of the plurality of memory elements, a unique portion of a second error value to the memory element; generating an output, for each memory element of the plurality of memory elements, in response to an address based upon the first error value and the unique portion of the second error value; and adding the outputs of each memory element of the plurality of memory elements.

The method may further comprise selecting a number of memory elements which are coupled to receive portions of the second error value, and selecting, for each memory element of the plurality of memory elements, a number of bits of the second error value to couple to the memory element. Adding the output of each memory element may comprise adding partial products stored in the memory elements. Coupling a first error value to each memory element may comprise coupling an evaluated error locator derivative to each memory element, and coupling a unique portion of the second error signal may comprise coupling a unique portion of an evaluated error evaluator. The method may further comprise generating a sum representing a Galois Field division.

DETAILED DESCRIPTION

Figure 1:
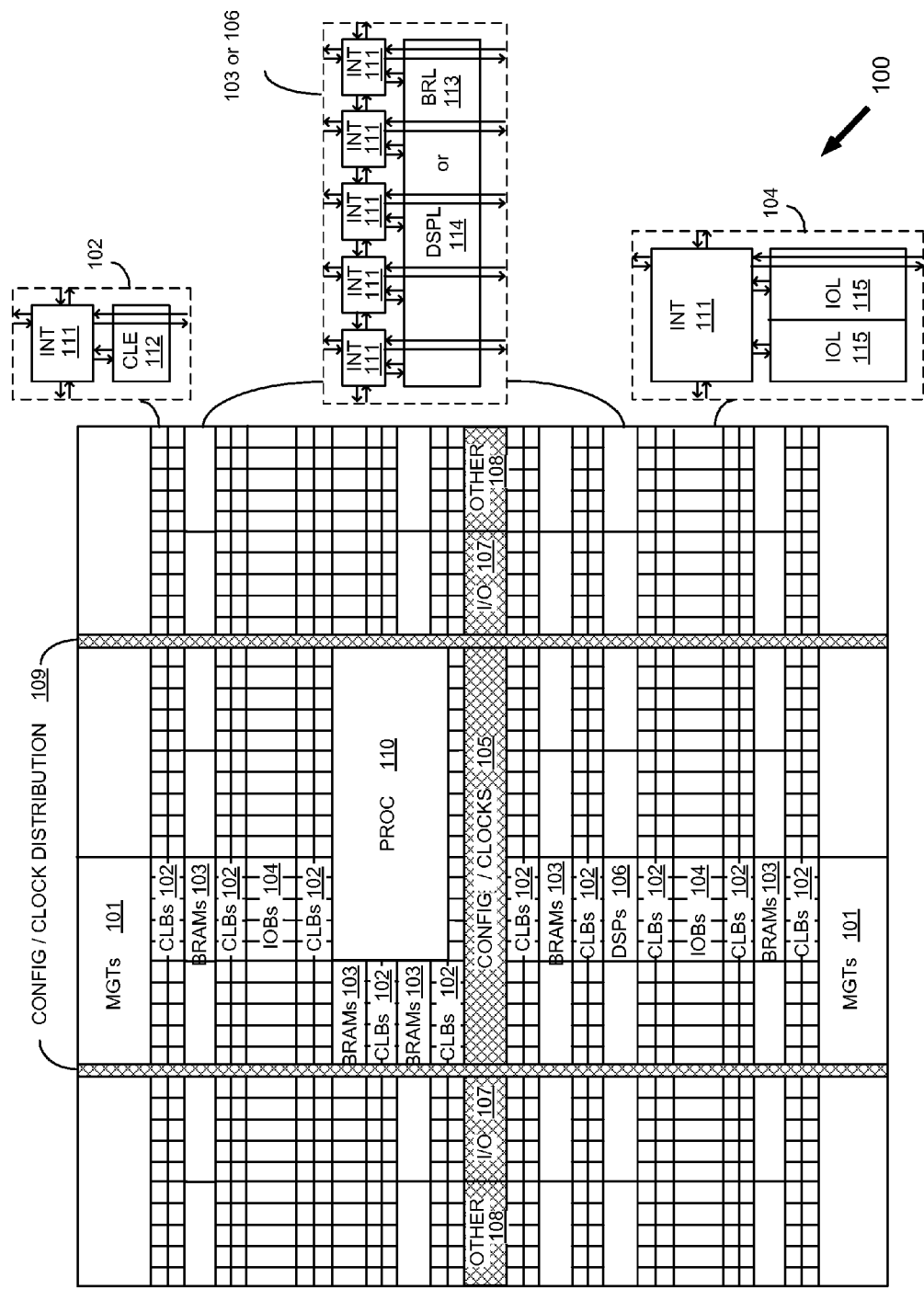
FIG. 1 is a block diagram of a programmable integrated circuit device having programmable resources according to an embodiment.

Turning first to FIG. 1, a block diagram of a programmable integrated circuit device having programmable resources is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 1 comprises an FPGA architecture 100 having a large number of different programmable tiles including multi-gigabit transceivers (MGTs) 101, CLBs 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110, which may be used to implement a software application, for example.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 may include a configurable logic element (CLE) 112 that may be programmed to implement user logic plus a single programmable interconnect element 111. A BRAM 103 may include a BRAM logic element (BRL) 113 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 106 may include a DSP logic element (DSPL) 114 in addition to an appropriate number of programmable interconnect elements. An IOB 104 may include, for example, two instances of an input/output logic element (IOL) 115 in addition to one instance of the programmable interconnect element 111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear in order to facilitate the efficient implementation of user logic.

Figure 2:
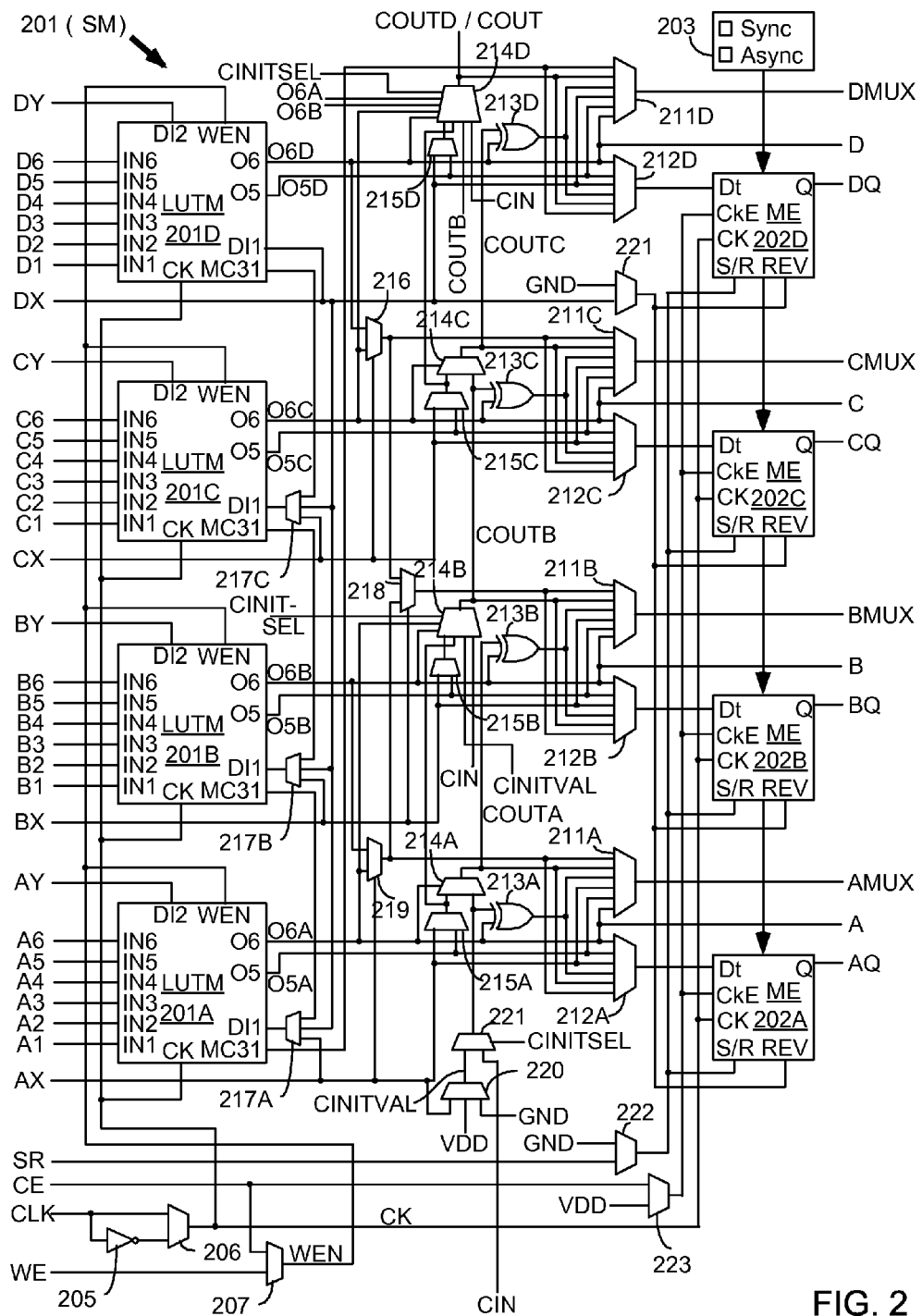
FIG. 2 is a block diagram of a configurable logic element according to an embodiment.

Turning now to FIG. 2, a block diagram of a configurable logic element is shown. In particular, FIG. 2 illustrates in simplified form a configurable logic element of a configuration logic block 102 of FIG. 1. In the embodiment of FIG. 2, slice M 201 includes four lookup tables (LUTMs) 201A-201D, each driven by six LUT data input terminals A1-A6, B1-B6, C1-C6, and D1-D6 and each providing two LUT output signals O5 and O6. The O6 output terminals from LUTs 201A-201D drive slice output terminals A-D, respectively. The LUT data input signals are supplied by the FPGA interconnect structure via input multiplexers, which may be implemented by programmable interconnect element 211, and the LUT output signals are also supplied to the interconnect structure. Slice M also includes: output select multiplexers 211A-211D driving output terminals AMUX-DMUX; multiplexers 212A-212D driving the data input terminals of memory elements 202A-202D; combinational multiplexers 216, 218, and 219; bounce multiplexer circuits 222-223; a circuit represented by inverter 205 and multiplexer 206

(which together provide an optional inversion on the input clock path); and carry logic having multiplexers 214A-214D, 215A-215D, 220-221 and exclusive OR gates 213A-213D. All of these elements are coupled together as shown in FIG. 2. Where select inputs are not shown for the multiplexers illustrated in FIG. 2, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 2 for clarity, as well as from other selected figures herein.

In the pictured embodiment, each memory element 202A-202D may be programmed to function as a synchronous or asynchronous flip-flop or latch. The selection between synchronous and asynchronous functionality is made for all four memory elements in a slice by programming Sync/Asynch selection circuit 203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 202A-202D are clocked by a clock signal CK, which may be provided by a global clock network or by the interconnect structure, for example. Such programmable memory elements are well known in the art of FPGA design. Each memory element 202A-202D provides a registered output signal AQ-DQ to the interconnect structure. Because each LUT 201A-201D provides two output signals, O5 and O6, the LUT may be configured to function as two 5-input LUTs with five shared input signals (IN1-IN5), or as one 6-input LUT having input signals IN1-IN6.

In the embodiment of FIG. 2, each LUTM 201A-201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 217A-217C for LUTs 201A-201C), or to the two 32-bit RAMs via input terminals DI1 and DI2. RAM write operations in the LUT RAMs are controlled by clock signal CK from multiplexer 206 and by write enable signal WEN from multiplexer 207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 201A may also be provided to the general interconnect structure for shift register chaining, via output select multiplexer 211D and CLE output terminal DMUX. Accordingly, the circuits and methods set forth below may be implemented in a device such as the devices of FIGS. 1 and 2, or any other suitable device.

Figure 3:
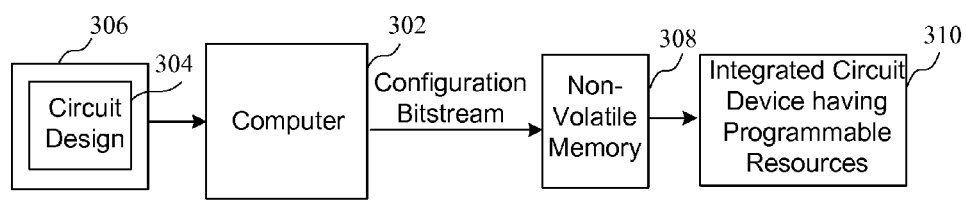
FIG. 3 is a block diagram of a system for programming a device having programmable resources according to an embodiment.

Turning now to FIG. 3, a block diagram of a system for programming a device having programmable resources is shown. In particular, a computer 302 is coupled to receive a circuit design 304 from a memory 306, and generate a configuration bitstream which is stored in the non-volatile memory 308. As will be described in more detail below, the circuit design may be a high level design, such as a circuit design defined in a hardware description language (HDL). Also, the computer may be configured to run software that generates a configuration bitstream which is stored in the non-volatile memory 308 and then provided to a device 310 having programmable resources. As will be described in more detail below, the device 310 may be any type of integrated circuit having programmable resources, such as a programmable logic device, or an application specific integrated circuit having programmable resources.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 302 may implement the portions of a circuit design implementing certain functions in configurable logic blocks (CLBs) or digital signal processing (DSP) blocks, for example. An example of a synthesis tool is the ISE® tool available from Xilinx, Inc. of San Jose, Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen available from Xilinx, Inc. of San Jose, Calif. The bitstream may also be encrypted according to a predetermined encryption standard. The bitstream is either downloaded by way of a cable or programmed into an EPROM for delivery to the programmable integrated circuit. If encoded, the bitstream is then decoded by the programmable integrated circuit according to the predetermined encryption standard.

To detect errors, parity bits are included within data. When data to be evaluated for errors is read back from a memory, check bits are generated based upon the data. The check bits of the data read back from memory should be zero if none of the bits including the data bits and the parity bits have been corrupted. The generated checkbits, called the syndrome, may also be used to determine the location of a bit error. The concatenation of data bits and the parity bits of a Hamming code, for example, may be described by an ordered set (d+p,d) where d is the width of the data and p is the width of the parity. The minimum number of check bits required for a single bit error correction is derived from the equation $d+p+1 \leq 2^p$.

Check bits may be generated from evaluating the "exclusive ORing" (XORing) of certain bits of a Hamming code which are read back from memory. That is, the check bits of a syndrome are generated based upon the data which is being evaluated for errors including the parity bits. If one or more bit errors is introduced in the stored data, several check bits show errors. The combination of these check bit errors enables determining the nature of the error. If all of the elements of the syndrome vector are zeros, no error is reported. Any other non-zero result represents the bit error type and provides the location of any single bit errors to enable restoring the original data.

Figure 4:
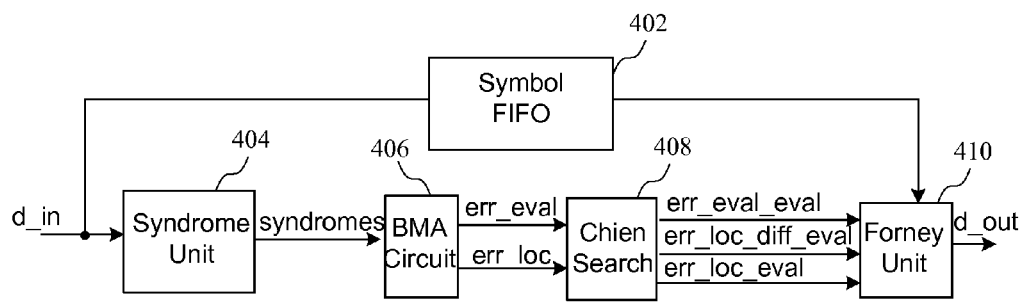
FIG. 4 is a block diagram of a decoder circuit according to an embodiment.

Another type of error correction code is a Reed-Solomon (RS) code. RS codes are linear block codes that can detect and correct burst errors. The n information symbols of a Reed-Solomon code word comprise k information symbols and n−k check symbols of s bits each. The RS decoder processes each block and attempts to correct errors and recover the original data. The decoder can correct up to t symbols that contain errors in the code word, where 2t=n−k. The number of errors detected can be used to indicate the status of a communication link. A block diagram of a decoder which may function as an RS decoder is shown in FIG. 4. In particular, an encoded data input (d_in) signal is coupled to a symbol FIFO 402 and a syndrome unit 404. Syndromes generated by the syndrome unit 404 are coupled to a BMA circuit 406. The BMA circuit 406 generates an error evaluator (err_eval) value and an error locator (errloc) value. The err_eval and err_loc values input to the block are the coefficients of the error evaluator and error locator polynomials, respectively. The Chien search block 408 evaluates these polynomials for every symbol index to produce 'evaluated' versions of the error evaluator and error locator polynomials, and more particularly an evaluated error evaluator (err_eval_eval) value and an evaluated error locator (err_loc_eval) value, respectively. It also evaluates the derivative of the error locator polynomial to generate an evaluated error locator derivative (err_loc_diff_eval) value. Differentiating the incoming polynomial may be easily achieved by shifting the coefficients by one place. The Formey unit 410 is coupled to receive the err_eval_eval, the err_loc_eval, and the err_loc_diff_eval values and generate the decoded output. However, before describing the Formey unit 410 in more detail in reference to FIGS. 5-7, the BMA circuit 406 will be described.

One complex step in the decoding of a RS code is the key-equation solving step, which computes the error evaluator and error locator polynomials from the syndromes of the received code word. This computation of polynomials, which uses finite-field arithmetic and requires multiple stages of computation with a non-rectangular structure, may be achieved using the Berlekamp-Massey Algorithm (BMA), for example. A BMA decoder is used to determine an error locator polynomial, typically using a Chien search. That is, a received data stream will differ from a transmitted data stream by one or more errors represented by syndrome data. An error polynomial representing the errors is generated. While the computations of error evaluator and error locator polynomials may be implemented in control logic, such as counters, comparators, and finite state machines implemented in LUT resources in an FPGA, for example, this control logic would contribute significantly to the size and critical path of the decoder circuit. Furthermore, such logic tends to be tightly coupled to the data processing elements, and is thus difficult to share between multiple datapath circuits.

According to the BMA circuit of FIG. 4, the generation of control signals may be enabled with the use of a memory, such as a ROM containing a small program (microcode) which generates the control signals necessary to access memory of a data processing circuit, such as a BMA datapath circuit, in order to implement an RS decoder. That is, rather than generating control signals using control logic, control signals necessary to access memory of a data processing circuit are generated by a program ROM. The ROM can be indexed by a small binary counter or a linear feedback shift register (LFSR), the advance of which is controlled by a small number of hand shaking signals to ensure that the circuit starts and stops operation at the appropriate times. Alternatively, the program counter may be a binary counter or a gray code counter, for example. According to one embodiment, the program ROM can be implemented using a single BRAM resource in the FPGA. In some cases a LUT-based ROM, rather than a BRAM-based ROM, might be appropriate for implementing an instruction generator, as will be described in more detail below. For example, a LUT-based ROM of a CLE described in FIG. 2 could be used instead of a BRAM of FIG. 1.

Depending on the parameters of the Reed-Solomon code being processed, the size and shape of the program ROM could be varied. Further, the control bus to the memories of a data processing circuit coupled to an instruction generator could be made narrower or wider than 32 bits, and the input to the address generator could be made narrower or wider than 8 bits. The instructions of the program ROM could be specified for a fixed set of code parameters. The instruction stream can be created when the decoder core is compiled, based on the supplied parameters. While specific reference is made to implementing a BMA circuit, a similar configuration could be applied to a key-equation solver using a different algorithm, such as the modified Euclidean algorithm.

Figure 5:
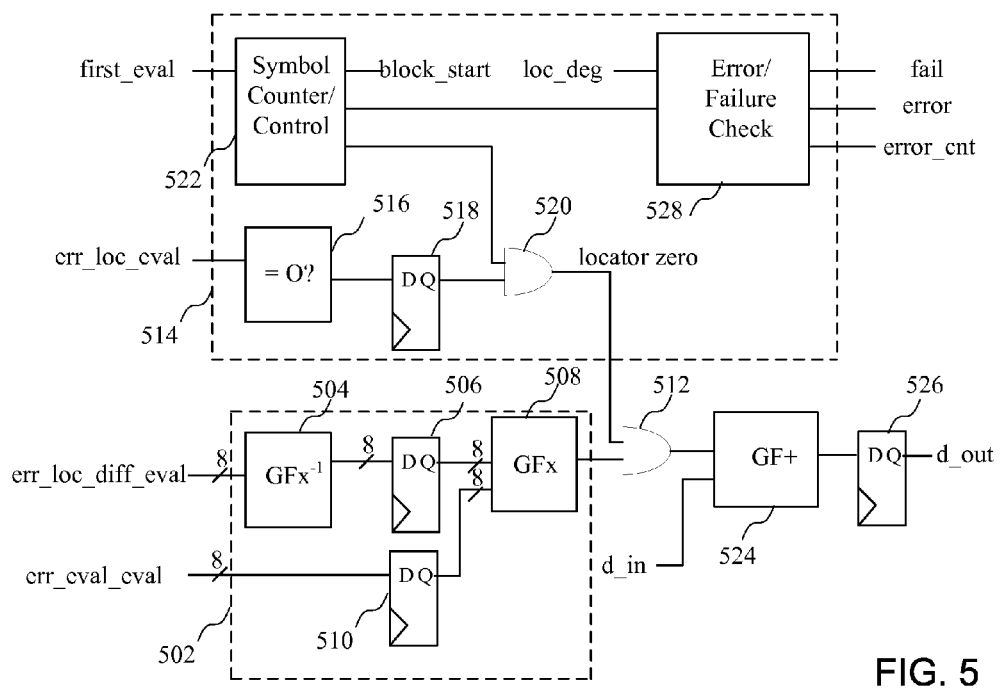
FIG. 5 is a block diagram of circuit for calculating error values at known error locations according to an embodiment.

Turning now to FIG. 5, a block diagram of circuit for calculating error values at known error locations according to an embodiment is shown. The circuit of FIG. 5 enables a Galois Field (GF) division circuit which forms part of a Reed-Solomon (RS) Decoder. When performing error correction in the final stage of an RS decoder, Galois Field (GF) division is required. After generating and evaluating the derivative of the error locator polynomial and the error evaluator polynomial, the Formey unit 410 must then divide the error evaluator polynomial by the derivative of the error locator polynomial to obtain an error vector. The error vector is added to each erroneous data symbol. The GF division may be performed in a divider circuit 502 by looking up the GF inverse of the evaluated error locator derivative value in a ROM, then multiplying the result by a delayed evaluated error evaluator value. In particular, divider circuit 502 comprises a GF inverse ROM 504, the output of which is coupled to a register 506. A multiplier 508 is coupled to receive an output of the register 506 and the err_eval_eval value stored in a register 510. The division operation of divider circuit 502 has considerable overall latency, and the divider consumes significant resources in the integrated circuit. Accordingly, the GF inverse ROM 504 will fail to make the most efficient use of BRAM resources for symbol widths of the err_loc_diff_eval value (which is input to the GF inverse ROM 504) which are less than 10 bits. As will be described in more detail below in reference to FIGS. 6 and 7, the divider circuit 502 can be replaced with a partial product circuit.

In order to ensure that only the erroneous input data is corrected by correction vector generated by the divider circuit 502, a control circuit 514 is implemented. The control circuit 514 comprises a comparator 516 which compares the err_loc_eval signal to zero, the output of which is stored in a register 518 coupled to an AND gate 520. The AND gate 520 also receives an output of a symbol counter/control circuit 522, which receives a first evaluation (first_eval) signal indicating the start of a block of data and generates a block start (block_start) signal. Assuming that the err_loc_eval signal is not equal to zero, and the first_eval signal is received, the locator zero output of the AND gate 520 enables the AND gate 512 to pass the output of the divider circuit 502 to an adder circuit 524. The output of the adder circuit 524 represents the input data, some of which may have been corrected by the error vector. That is, the AND gate 512 ensures that error vector is added to the input data d_in only when an erroneous data value needs to be corrected by the error vector. The output of the adder circuit 524 is registered in a register 526 to generate the d_out signal which represents the decoded data. Finally, an error/failure check circuit 528 is coupled to the symbol counter/control circuit 522 and a locator degree (loc_deg) signal indicating the degree of the error locator polynomial to generate appropriate error control signals, including an error signal, an error count signal, and a fail signal indicating when an error count has exceeded a predetermined number of errors.

Figure 6:
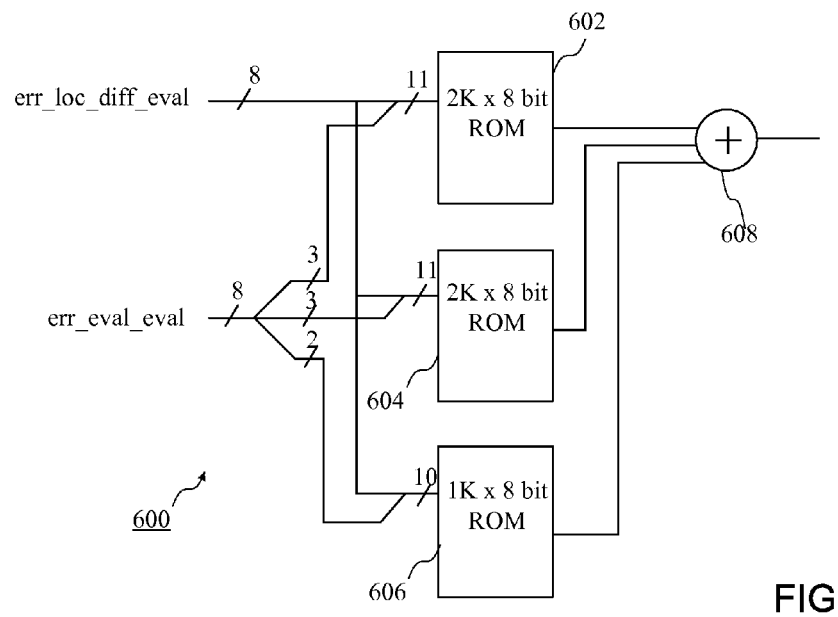
FIG. 6 is a block diagram showing a configuration of memory elements for providing a sum of products according to an embodiment.

As set forth above, the division operation by divider circuit 502 may have considerable overall latency, and may consume significant resources in the integrated circuit. For symbol widths of less than 10 bits input to the GF inverse ROM 504, the divider circuit 502 can be replaced with a partial product circuit 600 as shown in FIG. 6. The partial product circuit 600 comprises a small bank of independent ROMs 602-606, each of which combines a unary GF inversion operation with a partial multiplication. The partial products can then be summed using an adder circuit 608 to form the final product without requiring the multiplier 508. That is, the partial products are summed to form the error vector, which is then gated by the AND gate 512 with the locator zero value (which determines if the corresponding received input data symbol were in error). If there is an error in the received input data symbol, the error vector is added to the received input data symbol. The addition could be performed by XORing the error vector into the input data symbol, for example.

Figure 7:
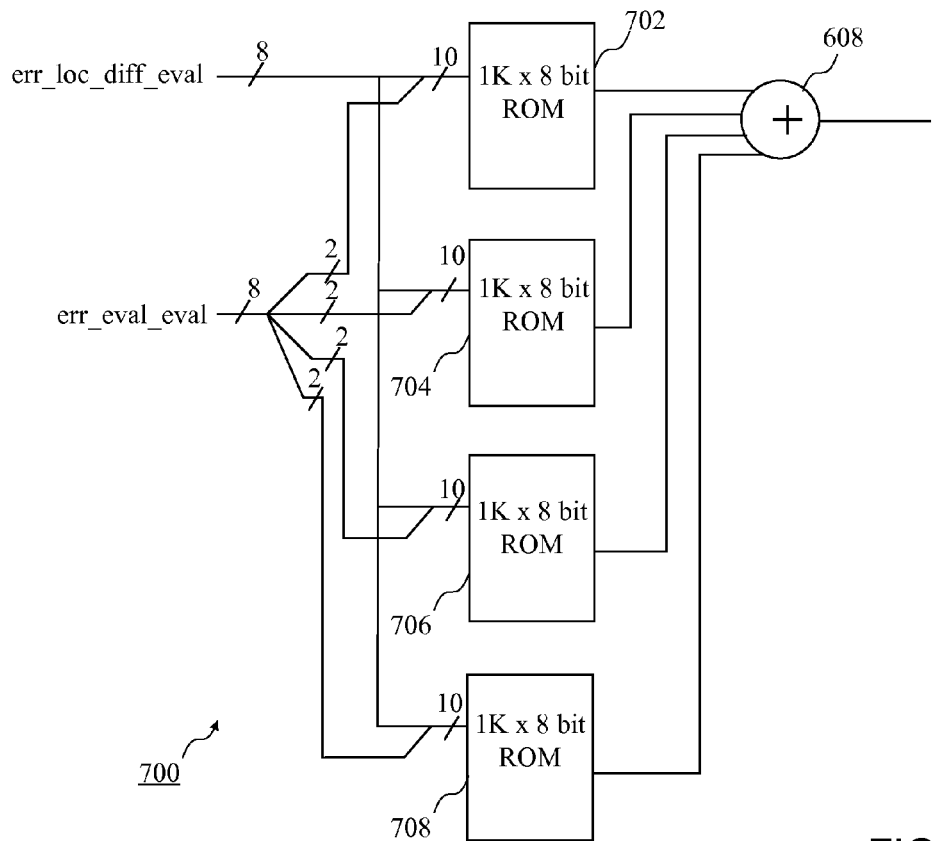
FIG. 7 is a block diagram showing a configuration of memory elements for providing a sum of products according to an alternate embodiment.

Accordingly, the partial product circuits of FIGS. 6 and 7 extend the GF inverse lookup operation to include the first stage of the GF multiplication operation. If a lookup function is designated as f(x) and the inputs as a and b, the circuits of FIGS. 6 and 7 compute the result r=f(a)*b by implementing that lookup directly. If a and b are 8-bit values, a 256×8-bit lookup table would be necessary for f(x), and an 8×8-bit Galois Field multiplier. The 256×8-bit lookup table takes up a small part of one BRAM, while the 8×8-bit Galois Field multiplier in the embodiment of FIG. 5 takes about 50 LUTs. Since it is beneficial to eliminate the requirements for LUTs in a device having programmable resources at the expense of more BRAM usage, the embodiments of FIGS. 6 and 7 provide a significant improvement over the embodiment of FIG. 5. Accordingly, b can be separated into two components b1 and b0, such that b1+b0=b. The separation can be done in a way such that each b1 and b0 are represented by only four bits. For example, if b were 11010011, then b can be represented by b1=11010000 and b0=00000011, where the bottom 4 bits of b1 are always 0, as are the top 4 bits of b0. Accordingly, if r=f(a)*b and b=b0+b1, then r=f(a)*b0+f(a)*b1. That is, each of the two terms on the right hand side of that equation is a partial product.

In operation, the entire evaluated error locator derivative value is used to address each ROM, along with a subset of the bits of the evaluated error evaluator value. The result of these parallel lookups is an array of partial products which can simply be summed to obtain the error vector. As shown in FIG. 6, each of the err_loc_diff_eval signal and the err_eval_eval signal is an 8-bit signal. The err_loc_diff_eval signal and 3 bits of the err_eval_eval signal are combined to create an address for the ROM 602. The err_loc_diff_eval signal and another 3 bits of the err_eval_eval signal are combined to create an address for the ROM 604. Finally, the err_loc_diff_eval signal and the remaining 2 bits of the err_eval_eval signal are combined to create an address for the ROM 606. That is, each ROM receives a unique portion of the err_eval_eval signal. The partial product outputs of the ROMS 602-606 are then summed by the adder circuit 608.

In the embodiment of FIG. 6, there are three ROMs, each of which can be implemented in a single 18 kilobit (Kb) BRAM block. Since only a single port of each ROM is used, these ROMs can potentially be shared between two divider circuits operating in parallel, resulting in an effective cost of 1.5 18 Kb BRAMs per block. When implementing the partial product circuit of FIG. 6, ROMs 602 and 604 could be implemented in a single dual port ROM, while ROM 606 could be implemented in a portion of a second dual port ROM. For example, a 2K×8 ROM could be configured to store 8 bit words associated with both ROM 602 and ROM 604, where 1K of the 2K 8-bit memory locations are allocated for ROM 602 and the other 1K of the 2K 8-bit memory locations are allocated for the ROM 604. The remaining portion of RAM 606 may be implemented with another GF divider circuit. Furthermore, assuming that there are no more than four such partial products, this summation can be performed using no logic resources other than those that are already required to combine the error vector with the received data symbol. According to the embodiments of FIGS. 6 and 7, the GF multiplier 508 is eliminated completely, thereby reducing the area of the decoder circuit. Because the latency created by the multiplier is eliminated, it is also no longer necessary to delay the evaluated error evaluator value, yielding further area savings by eliminating register elements. While number of lookup ROMs required may be increased when implementing the embodiments of FIGS. 6 and 7 compared to the embodiment of FIG. 5, these ROMs may be shared between multiple decoder units. Further, BRAM resources are rarely a limiting factor when implementing decoder circuits in devices having programmable resources, and such additional ROMs may be easily accommodated.

In the embodiment of FIG. 7, there are four ROMs 702-708 coupled to the adder circuit 808. According to the embodiment of FIG. 7, the err_loc_diff_eval signal and 2 distinct bits of the err_eval_eval signal are combined to create an address for each of the ROMs 702-708. The partial product outputs of the ROMs 702-708 are then summed by the adder circuit 608. The ROMs can be implemented in pairs, with each pair fitting in a single 18 Kb BRAM using both ports. A dual port RAM which may be used to implement the ROMs 602-606 and the ROMs 702-708 will be described in more detail in reference to FIG. 8. The resources required to implement the partial product circuit of FIG. 7 includes two 18 Kb BRAMs per block, where ROMs 702 and 704 may be implemented in one BRAM and ROMs 706 and 708 may be implemented in another BRAM. In a device having programmable resources, such as the FPGA device of FIG. 1, the Formey operation of the RS decoder can be carried out within a single 6-input LUT per output bit (i.e., 8 LUTs) and a limited number of BRAMs. For symbol widths greater than 9 bits, the circuit arrangement of FIGS. 6 and 7 are still valid but less useful because it tends to yield too large a ROM array. Accordingly, the embodiment of FIG. 5 may be implemented for symbol widths greater than 9. For symbol widths below 4 or 5, for example, a direct lookup of the quotient may be a more appropriate solution.

Figure 8:
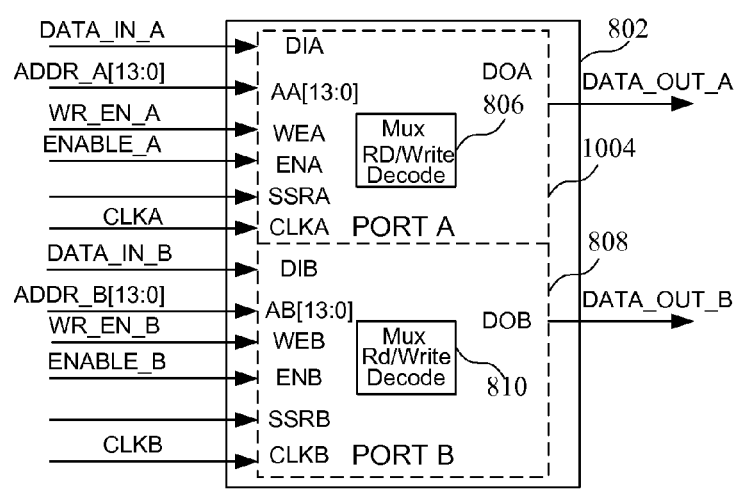
FIG. 8 is a block diagram of a dual port random access memory according to an embodiment.

Turning now to FIG. 8, a block diagram of a dual port random access memory according to an embodiment is shown. As shown for example in the block diagram of a conventional dual port BRAM of FIG. 8, each port comprises a multiplexer read write decode logic circuit. That is, the dual port BRAM 802 comprises a first port 804 having a multiplexer read/write decode logic circuit 806, and a second port 808 also having a multiplexer read/write decode logic circuit 810. The multiplexer read/write decoder circuits enable writing to and reading from the two ports in response to clock, enable and address signals as shown. For Port A for example, DATA_IN_A is stored at an address ADDR_A[13:0] in response to a write enable signal (WR_EN_A), and may be read from the memory in response to a read enable signal ENABLE_A.

Figure 9:
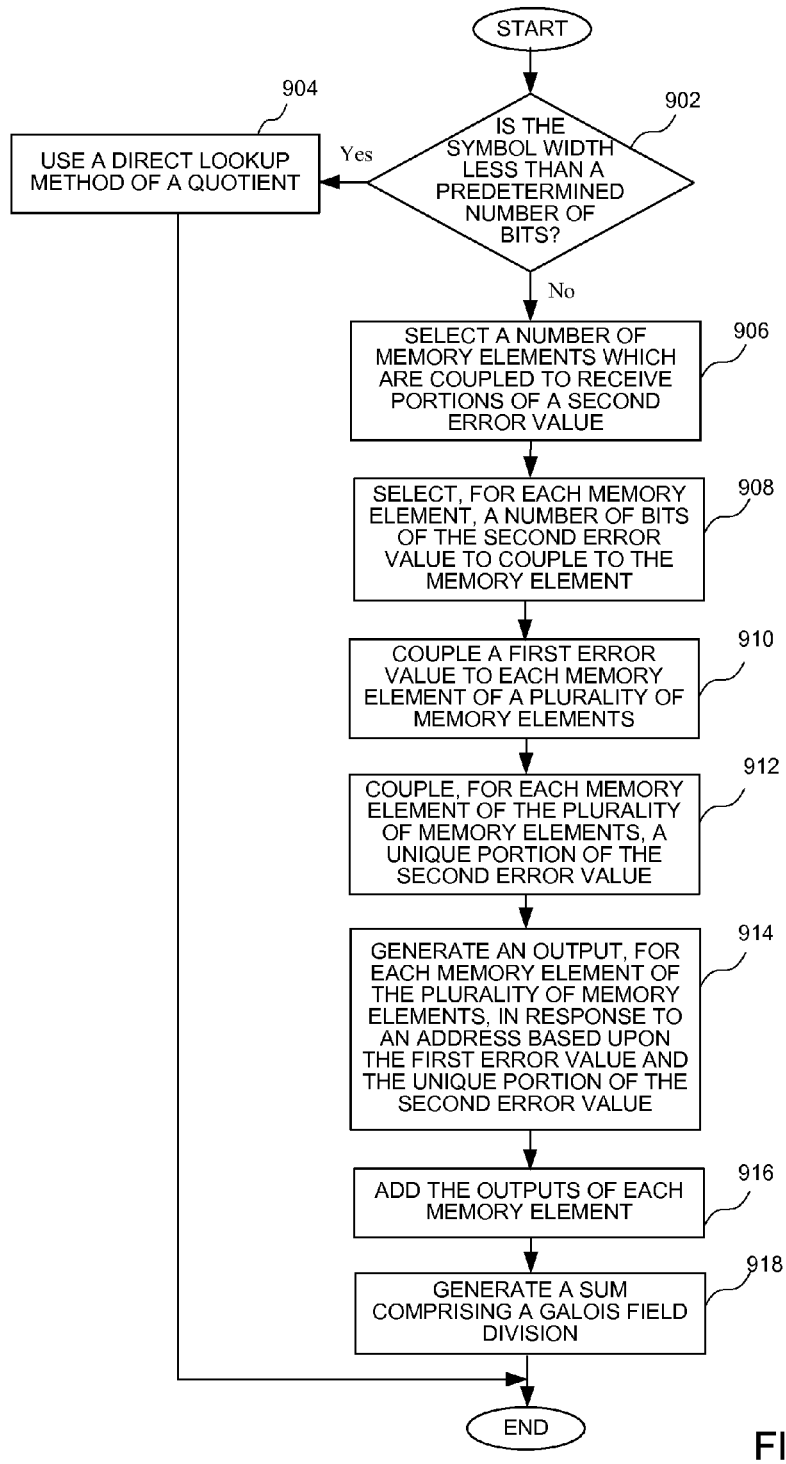
FIG. 9 is a flow chart showing a method of decoding data having an error correction code according to an embodiment.

Turning now to FIG. 9, a flow chart shows a method of decoding data having an error correction code according to an embodiment. In particular, it is determined whether a symbol width of an input to a ROM, such as GF inverse ROM 504, is less than a predetermined number of bits at a step 902. If so, a direct lookup method of finding a quotient is used at a step 904. If not, a number of memory elements which are coupled to receive portions of the second error value is selected at a step 906. A number of bits of the second error value to be coupled to the memory element is selected, for each memory element, at a step 908. A first error value is coupled to each memory element of a plurality of memory elements at a step 910. A unique portion of a second error value is couple to a memory, for each memory element of the plurality of memory elements, at a step 912. An output, for each memory element of the plurality of memory elements, in response to an address based upon the first error value and the unique portion of the second error value is generated at a step 914. The outputs of each memory element are added at a step 916, and a sum comprising a Galois Field division is generated at a step 918. The method of FIG. 9 may be implemented using the circuits of FIGS. 1-8 as described, or other suitable circuits. While various elements of the method of FIG. 9 are shown, it should be understood that additional details related to the elements shown, or additional elements which could be implemented, may be found in the descriptions of the circuits of FIGS. 1-8.

It can therefore be appreciated that the new and novel decoder and method of decoding data having an error correction code has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A circuit enabling generating a product in a decoder circuit, the circuit comprising:
    a first memory element coupled to receive a first error value and a first portion of a second error value;
    a second memory element coupled to receive the first error value and a second portion of the second error value; and
    an adder circuit coupled to add an output of the first memory element and an output of the second memory element, the adder circuit having a number of inputs equal to the number of memory elements,
    wherein:
    the output of the first memory element is generated in response to a first address comprising the bits of the first error value and the bits of the first portion of the second error value, which are combined to create the first address, wherein the output is a product of the first error value and the first portion of the second error value; and
    the output of the second memory element is generated in response to a second address comprising the bits of the first error value and the bits of the second portion of the second error value, which are combined to create the second address, wherein the output is a product of the first error value and the second portion of the second error value.

2. The circuit of claim 1, wherein the first error value is an evaluated error locator derivative and the second error value is an evaluated error evaluator.

3. The circuit of claim 1, wherein each of the first memory element and the second memory element comprises a 2 kilobit-by-8 memory array.

4. The circuit of claim 3, further comprising a third memory element coupled to receive the first error value and a third portion of the second error value.

5. The circuit of claim 4, wherein the third memory element comprises a 1 kilobit-by-8 memory array.

6. The circuit of claim 4, wherein the second error value comprises an 8-bit signal.

7. The circuit of claim 6, wherein the 8 bits of the second error value are divided between the first, second and third portions of the second error value.

8. A circuit enabling generating a product in a decoder circuit, the circuit comprising:
    a first memory element coupled to receive a first error value and a first portion of a second error value;
    a second memory element coupled to receive the first error value and a second portion of the second error value;
    a third memory element coupled to receive a first error value and a third portion of a second error value;
    a fourth memory element coupled to receive the first error value and a fourth portion of the second error value; and
    an adder circuit coupled to add outputs of the first, second, third, and fourth memory elements, the adder circuit having a number of inputs equal to the number of memory elements,
    wherein:
    the output of the first memory element is generated in response to a first address comprising the bits of the first error value and the bits of the first portion of the second error value, which are combined to create the first address, wherein the output is a product of the first error value and the first portion of the second error value;
    the output of the second memory element is generated in response to a second address comprising the bits of the first error value and the bits of the second portion of the second error value, which are combined to create the second address, wherein the output is a product of the first error value and the second portion of the second error value;
    the output of the third memory element is generated in response to a third address comprising the bits of the first error value and the bits of the third portion of the second error value, which are combined to create the third address, wherein the output is a product of the first error value and the third portion of the second error value; and
    the output of the fourth memory element is generated in response to a fourth address comprising the bits of the first error value and the bits of the fourth portion of the second error value, which are combined to create the fourth address, wherein the output is a product of the first error value and the fourth portion of the second error value.

9. The circuit of claim 8, wherein the first error value is an evaluated error locator derivative and the second error value is an evaluated error evaluator.

10. The circuit of claim 8, wherein each of the first, second, third and fourth memory elements comprises a 1 kilobit-by-8 memory array.

11. The circuit of claim 8, wherein:
    the first and second memory elements are portions of a first dual port random access memory; and
    the third and fourth memory elements are portions of a second dual port random access memory.

12. The circuit of claim 8, wherein the circuit comprises a Reed-Solomon decoder.

13. The circuit of claim 12, wherein an output of the adder circuit comprises a Galois Field division result.

14. The circuit of claim 13, wherein the first, second, third, and fourth memory elements are implemented in an integrated circuit having programmable resources.

15. A method of generating a product in a decoder circuit, the method comprising:

coupling a first error value to each memory element of a plurality of memory elements;

coupling, for each memory element of the plurality of memory elements, a unique portion of the bits of a second error value to the memory element;

generating an output, for each memory element of the plurality of memory elements, in response to an address comprising the bits of the first error value and the bits of the unique portion of the second error value, which are combined to create the address, wherein the output is a product of the first error value and the unique portion of the second error value; and adding, by an adder circuit, the outputs of each memory element of the plurality of memory elements, the adder circuit having a number of inputs equal to the number of memory elements.

16. The method of claim 15, further comprising selecting a required number of memory elements which are coupled to receive portions of the second error value.

17. The method of claim 16, further comprising selecting, for each memory element of the plurality of memory elements, a number of bits of the second error value to couple to the memory element.

18. The method of claim 15, wherein adding the output of each memory element comprises adding partial products stored in the plurality of memory elements.

19. The method of claim 15, wherein:

coupling a first error value to each memory element comprises coupling an evaluated error locator derivative to each memory element; and coupling a unique portion of the second error signal comprises coupling a unique portion of an evaluated error evaluator.

20. The method of claim 19, further comprising generating a sum representing a Galois Field division.

* * * * *